United States Patent [19]
Gilliland et al.

[11] Patent Number: 6,137,161
[45] Date of Patent: Oct. 24, 2000

[54] INTERPOSER ARRAY MODULE FOR CAPACITIVE DECOUPLING AND FILTERING

[75] Inventors: Don Alan Gilliland; James Larry Peacock, both of Rochester, Minn.

[73] Assignee: International Business Machines Corporation, Armonk, N.Y.

[21] Appl. No.: 09/395,703

[22] Filed: Sep. 14, 1999

[51] Int. Cl.[7] ........................... H01L 23/02; H01L 23/52; H01L 23/053
[52] U.S. Cl. ......................... 257/678; 257/734; 257/691; 257/701
[58] Field of Search ................................... 257/734, 691, 257/678, 698–700, 797, 924, 778, 701

[56] References Cited

U.S. PATENT DOCUMENTS

| | | | |
|---|---|---|---|
| 4,812,949 | 3/1989 | Fontan et al. | 361/386 |
| 5,016,087 | 5/1991 | Haug et al. | 357/75 |
| 5,177,594 | 1/1993 | Chance et al. | 257/678 |
| 5,369,545 | 11/1994 | Bhattacharyya et al. | 257/724 |
| 5,371,403 | 12/1994 | Huang et al. | 257/691 |
| 5,668,399 | 9/1997 | Cronin et al. | 257/532 |
| 5,790,384 | 8/1998 | Ahmad et al. | 361/760 |
| 5,841,686 | 11/1998 | Chu et al. | 365/51 |

*Primary Examiner*—David Hardy
*Assistant Examiner*—Jhihan B Clark
*Attorney, Agent, or Firm*—Robert W. Lahtinen

[57] ABSTRACT

A semiconductor package includes a circuit chip which presents electrical contacts configured and aligned for attachment to corresponding contacts on a supporting substrate. The semiconductor package further includes an interposer with upper surface contacts aligned with the circuit chip contacts and lower surface contacts aligned with the corresponding contacts on the supporting substrate. The interposer includes a series of ground plane layers which are capacitively coupled to the conductors that connect the upper surface contacts to the lower surface contacts. The ground plane layers closest to the circuit chip have plates therebetween and electrically separated therefrom which are connected to the power input supply lines to form decoupling capacitances. The ground plane layers more remote from the circuit chip have, therebetween and electrically separated therefrom, conductive flange portions attached to individual signal lines to form a low pass feed through filter for each signal line. The capacitance of the flange portions is designed to establish the correct roll off to pass the desired signals and shunt to ground the unwanted harmonics while the decoupling capacitance is sized to afford the required, stabilized power supply. The semiconductor package also may include a conductive shield member that surrounds the top and four sides of the package and is connected to the grounded elements of the interposer to provide mechanical connection and apply ground potential to the shield.

11 Claims, 3 Drawing Sheets

INTERPOSER ARRAY MODULE FOR CAPACITIVE DECOUPLING AND FILTERING

FIELD OF THE INVENTION

This invention relates to semiconductor packaging and more particularly, to an interposer array module disposed between a semiconductor chip and the surface contacts presented by a mounting surface.

BACKGROUND OF THE INVENTION

The switching of logic circuits on densely integrated modules or chips gives rise to electrical noise in the form of transient current or voltage spikes that must be decoupled or damped. A conventional means for effecting decoupling is to use decoupling capacitors, either external to the circuit module or as a portion of the module.

Where a remote external capacitor is used, an inductive path is established which does not allow damping of the electrical noise. Though a discrete capacitance may be moved closer, it is not possible to place a capacitor on board in sufficiently close proximity to prevent voltage drop or noise. Not only do problems persist using these solutions, but the components that implement the practice tend to be both ineffective and larger than desirable. On chip capacitance is the ideal solution, but the inherently large space required for a capacitive element prevents optimum use of chip space or real estate, adding to chip complexity, which is a significant problem as ever higher circuit densities are sought.

It is also necessary to pass the signals on signal lines from the circuit module without permitting the escape of unwanted harmonics. It is vital that such unwanted signals be removed nearest the source and only the desired bandwidth of signals be transmitted from the module enclosure. Each signal line should be provided with a filtering capability adapted to cut off signals having a frequency that exceeds a designated bandwidth of frequencies on the line to reduce spurious signals or noise that may escape the shielded confinement of the circuit module package assembly.

SUMMARY OF THE INVENTION

Using the interposer array of the present invention, capacitive decoupling is provided adjacent the interposer surface which adjoins the circuit chip to provide a uniform power source immediately adjacent the circuit module and minimize inductance between the decoupling capacitance and the powered circuits of the module.

Each of the signal lines connected to the circuit module is capacitively coupled to ground by effecting a feed through capacitance. Each signal line is individually filtered before leaving the shielded containment of the composite module assembly including the circuit chip and interposer array. The magnitude of the filtering capacitance is adjusted to discriminate between the normal signal and unwanted signals with respect to the circuit chip operating circuit signal frequency. Thus the response is tailored to the needed frequencies with regard to the signal characteristics of the associated circuit module.

The ground planes of the interposer array are organized and positioned to form a part of the containment, optimizing the shielding effectiveness at the interface of the composite module assembly and the confronting printed circuit board which is not enclosed by the shield that adjoins the assembly top and sides. This effectively completes the shielded containment of the chip module and interposer array assembly.

Use of the design of the present invention essentially moves the cost of the printed circuit board configured for distributed decoupling, to a smaller board in the form of an interposer array that is placed near the module it serves. This allows the larger board to move to fewer layers with reduced cost while still providing decoupling capacitance to the module. The interposer array further provides the feed through capacitance type filtering for signals that exit the module. This filtering of signals passing into and out of the containment enhances the shielding effectiveness of the composite module assembly.

DETAILED DESCRIPTION

Figure 1:
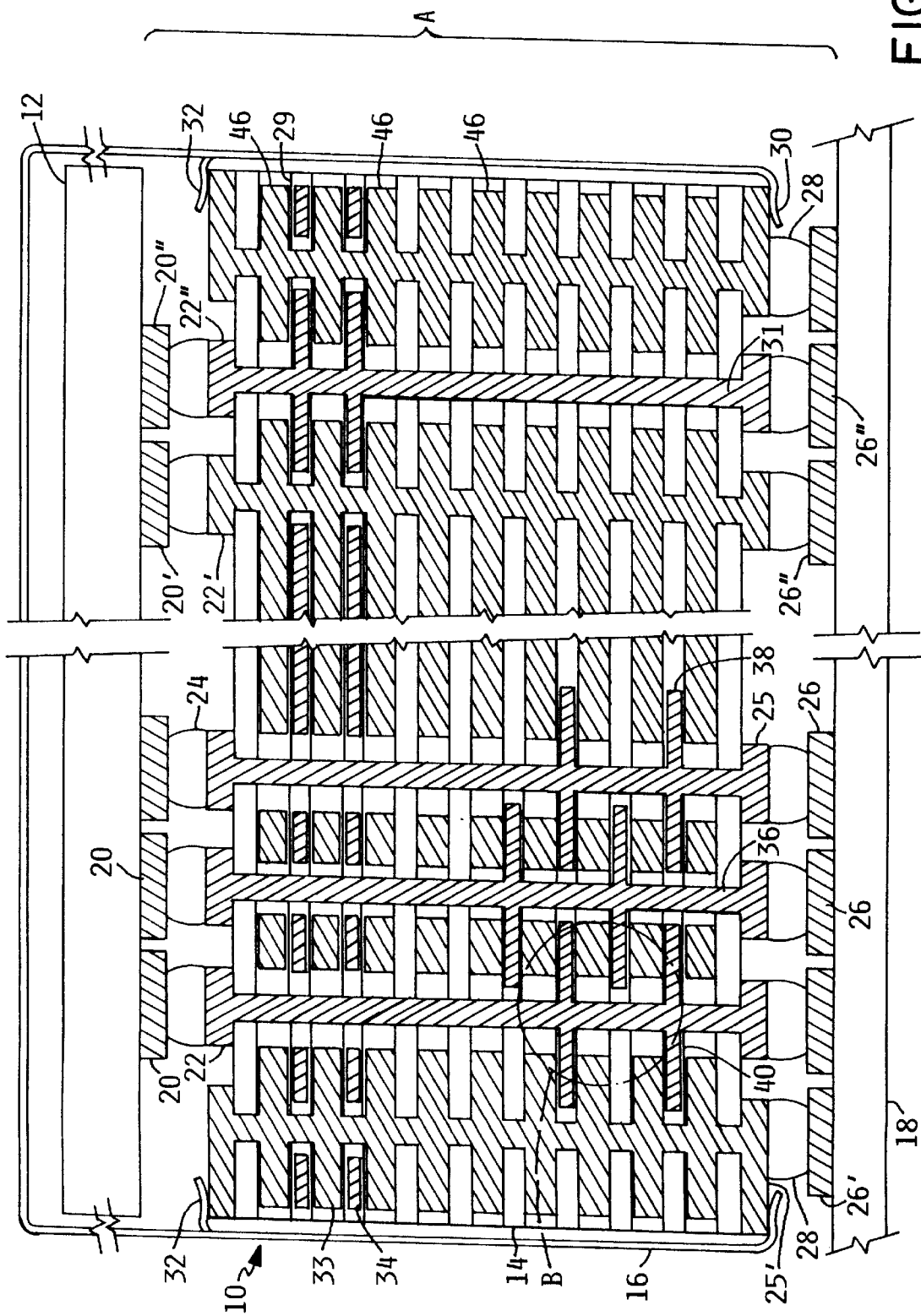
FIG. 1 is an enlarged, interrupted schematic section view of the shielded circuit chip/interposer array assembly of the present invention with the height of the interposer array further enlarged for purposes of illustration.
Figure 2:
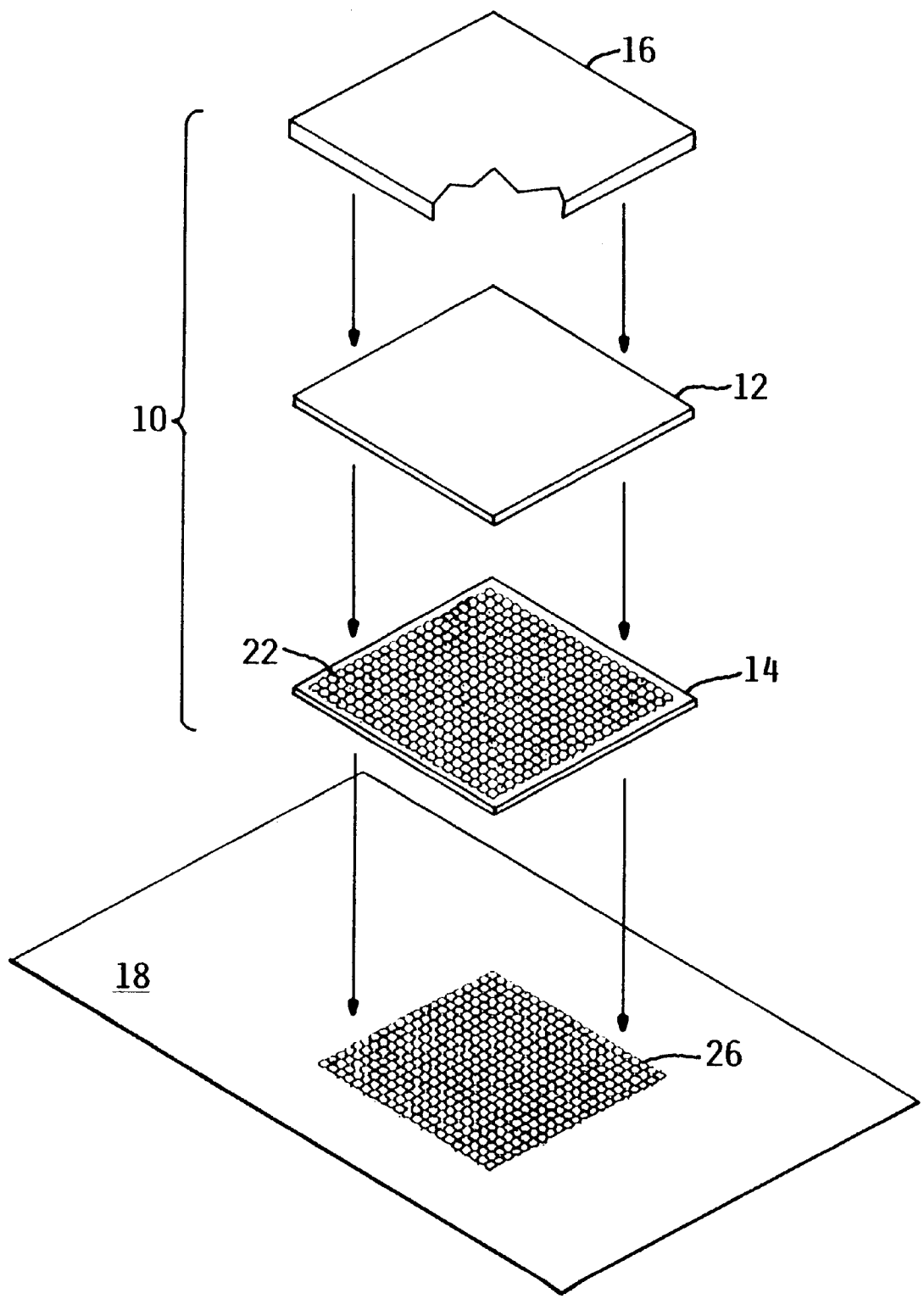
FIG. 2 is an exploded view of the shield, circuit chip and interposer array assembly and the printed circuit board upon which the assembly is mounted.
Figure 3:
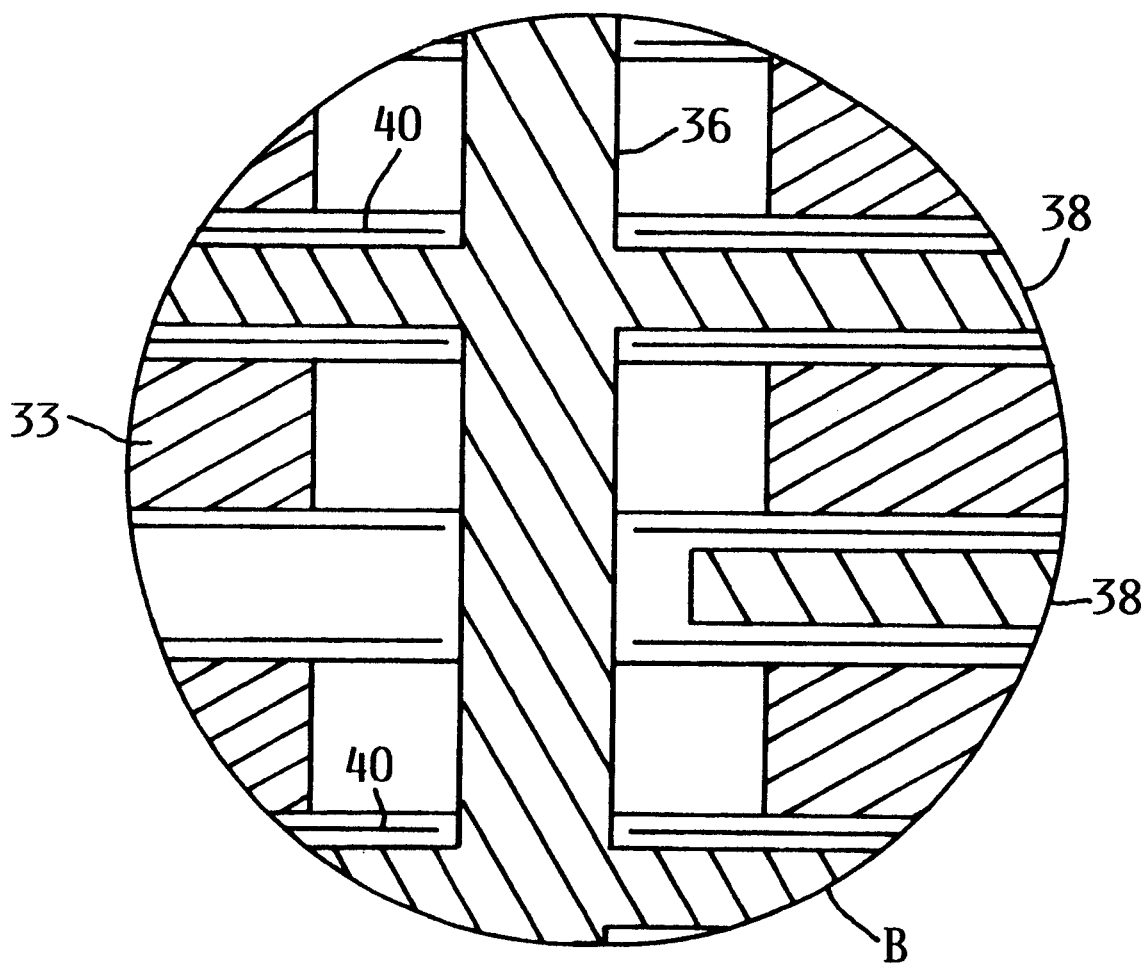
FIG. 3 is an enlarged illustration of the portion of FIG. 1 enclosed within the dashed line circle B showing greater detail.

Referring to FIG. 1, a semiconductor circuit package 10 includes a circuit module or chip 12 and an interposer array 14 enclosed by a shield 16. FIG. 1 is an enlarged view of the circuit package with the vertical dimension within the bracket A being much enlarged for purposes of illustration and description. If all dimensions of FIG. 1 were to scale, the vertical height of the interposer array would be similar to the thickness of the substrate printed circuit board 18 on which the package is mounted or the circuit chip 12. The showing of FIG. 1 is not only schematic, but also simplified by not showing all the detail lines to enable illustration of the elements without confusing detail. FIG. 3 shows the portion of FIG. 1 within the dashed line circle B showing in more detailed form the ground plane elements 33, signal line vias 36 with capacitor plate flange portions 38, and dielectric separators 40. The ground plane elements 33 extend over the length and width of the interposer array with circular openings through which the signal line vias extend. FIG. 2 is an exploded schematic view of the module assembly 10 incorporating the present invention with the shield 16 partially broken away. The circuit chip 12 is connected to the interposer 14 at a matrix of contact locations 22 and the assembly of circuit chip and interposer is surrounded on the top and four sides by shield 16. The module assembly as attached to the matrix of contact locations 26 and supported on the printed circuit board 18.

The circuit chip or module 12 presents a series of contacts 20, 20' and 20" at the lower surface which are connected to aligned contacts 22, 22' and 22" on the interposer array 14 upper surface by solder balls 24. Connection between interposer array 14 and contacts 26, 26' and 26" on the printed circuit board 18 is effected by solder balls 28. The combined circuit chip 12 and interposer array 14 assembly is enclosed by a continuous conductive metal shield 16 that extends across the top and along the four sides and is mechanically attached to the interposer array 14 by a flange 30 along the bottom margins and a series of tabs 32. The flanges 30 and tabs 32 connect to the grounded portion 33 of the interposer to provide ground potential to shield 16 surrounding the circuit chip 12 and interposer array 14.

The interposer array 14 of FIG. 1 is shown schematically as an auxiliary module having lines 31, that are the equivalent of plated through vias, connected to or formed integrally with plate surfaces 34 that are capacitively coupled to planar elements that form a part of ground 33 and are separated therefrom by dielectric material 29 to provide capacitive decoupling to the power planes. Similarly, signal line vias 36 include, as an integral part thereof, flanges or plates 38 which are capacitively coupled to planar portions that form a part of the ground structure 33 and are separated therefrom by dielectric material 40 to afford filtering of the signal lines. In practice, the interposer array would be formed as a sequence of deposited metal and dielectric films on a substrate or as a small multilayered printed circuit board to produce the signal and power line, capacitor plate and ground plane functions of the structure illustrated in FIG. 1.

The interposer module 14, throughout its height, includes numerous parallel layers that are a part of ground 33 and are commonly connected to ground potential. Ground potential is maintained by contact surfaces 25' which are connected to the circuit board ground contacts 26' by respective solder balls 28 and to the circuit chip from one or more contacts 20'.

A power line via 31 extends from the circuit board contact 26" to the power input contact 20" on circuit chip 12. The via 31 includes attached decoupling capacitor plates 34 which extend through the spaces between parallel grounded metal layers 46 which are in closest proximity to the circuit chip. The grounded layers 46 are separated from the confronting decoupling capacitor plates by a film of dielectric material 29. The distributed decoupling capacitance is thus positioned in closest proximity to circuit 12 chip to minimize the inductance between such decoupling capacitance and the using circuits on chip 12. The extent of the decoupling capacitor plates 34 (and the number thereof) is determined by the decoupling requirements of the particular circuit chip 12 so that a reliable and stable voltage supply is available under all conditions of circuit chip operation. As shown, two decoupling capacitor plates 34 are connected to the power line via 31 and are substantially coextensive with the length and width of the interposer array 14 while presenting circular openings through which the signal lines and ground plane vias pass with sufficient clearance to assure that signals on such lines are not impacted.

The signal lines or vias 36, which afford feed through by interconnecting signal contacts 20 on the circuit chip 12 with corresponding signal contacts 26 on the printed circuit board 18, may require filtering to preclude the escape of unwanted signals. It is only possible to interdict and remove unwanted signals before they escape the containment of the circuit module assembly enclosure. Therefore, filtering is needed to limit the escape of unwanted emissions from the circuit module assembly enclosure. The signal lines 36 are capacitively connected to the lower grounded metal layers by the flange portions 38 to form a low pass filter to which the signals passing through are subjected. Effectively, the interposer module signal lines 36 as shown present the sequence of an inductance, capacitive coupling to ground, an inductance, capacitive coupling to ground and an inductance of a feed through capacitor circuit filtering each individual signal line prior to leaving the shielded containment of the composite module assembly.

It will also be observed that the decoupling capacitor plates 34 (and the ground plane horizontal layers 46) are provided with significant clearance 44 around the signal line vias 36 to prevent the plate potential or ground from having an uncontrolled influence on the signals carried by such signal lines. Further, the array structure makes it possible to use one dielectric material (dielectric 29) in the decoupling section of the interposer and another dielectric material (dielectric 40) in the filtering section.

While the invention has been shown and described with reference to a preferred embodiment thereof, it will be understood by those skilled in the art that various changes in form and details may be made therein without departing from the spirit and scope of the invention.

What is claimed is:

1. A semiconductor package including a circuit module having a series of electrical contacts along a lower surface which are adapted to be connected to a substrate contact surface presenting a series of contacts positioned to be connected to said circuit module series of electrical contacts, said semiconductor package further comprising an interposer array having upper surface contacts respectively electrically connected to said circuit module series of electrical contacts and lower surface electrical contacts positioned to enable alignment and electrical connection with said substrate series of electrical contacts, said upper surface contacts being respectively connected to said lower surface electrical contacts to form input/output lines including power input lines and signal lines;

distributed capacitive means positioned within said interposer adjacent said interposer upper surface and connected to power input lines to provide distributed decoupling capacitance;

signal line to ground capacitances within said interposer array and connected to respective signal lines to permit the fundamental signal frequency to pass through while unwanted frequencies are shunted to ground; and continuous electrically conductive shielding adjacent the top and four sides of the composite connected structure of said circuit module and said interposer array which is electrically connected to ground circuits within said interposer array.

2. The semiconductor package, including an interposer array, of claim 1 wherein said distributed capacitive means is positioned as capacitive plate means parallel to and immediately adjacent to said circuit module and said signal line to ground capacitances are parallel to and separated from said distributed capacitance means and disposed further from said circuit module than said capacitance means.

3. The semiconductor package, including an interposer array, of claim 1 wherein said conductive shielding is mechanically connected to grounded portions of said interposer array to provide shielding mechanical support and an electrically grounded potential.

4. The semiconductor package, including an interposer array, of claim 2 wherein said signal line to ground capacitances provide individual signal line filtering.

5. The semiconductor package, including an interposer array, of claim 3 wherein said signal line to ground capacitances comprise a feed through capacitor circuit connected to each individual signal line.

6. A semiconductor package including a circuit module with a series of contacts along the lower surface which are electrically connected to a series of cooperating contacts on a supporting surface, said semiconductor package further comprising an interposer presenting upper surface contacts electrically connected to said circuit module series of contacts, lower surface contacts disposed for alignment with and electrical connection to said supporting surface cooperating series of contacts and input/output lines respectively connecting said upper surface contacts which include power input and signal lines;

distributed capacitance means positioned within said interposer adjacent said interposer upper surface and connected to at least one power input line to provide distributed decoupling capacitance; and signal line to ground capacitances disposed further from said circuit module than said distributed capacitance means to afford filtering of said signal lines.

7. The semiconductor package of claim 6 wherein said signal line to ground capacitances provide feed through capacitive filtering of said signal lines.

8. The semiconductor package of claim 7 wherein said signal line to ground capacitances provide individual filtering of each individual signal line.

9. The semiconductor package of claim 8 further comprising a conductive shield continuously enclosing the top and four sides of said semiconductor package.

10. The semiconductor package of claim 9 wherein said conductive shield is mechanically connected to a grounded portion of said interposer array to support and supply ground potential to said shield.

11. The semiconductor package of claim 10 wherein said distributed capacitive means comprises at last one conductive plate member connected to a power input line and separated from planar grounded elements by a first dielectric material and said signal line to ground capacitances comprise a flange or plate portion each connected to a signal line and separated from grounded planar portions by a second dielectric material.

* * * * *